(12) United States Patent  
Test

(10) Patent No.: US 7,294,923 B2  
(45) Date of Patent: Nov. 13, 2007

(54) METALLIZATION SCHEME INCLUDING A LOW MODULUS STRUCTURE

(75) Inventor: Howard Test, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/121,413

(22) Filed: May 4, 2005

(65) Prior Publication Data

US 2006/0249821 A1    Nov. 9, 2006

(51) Int. Cl.
- *H01L 23/53* (2006.01)
- *H01L 23/12* (2006.01)
- *H01L 23/48* (2006.01)
- *H01L 23/52* (2006.01)
- *H01L 29/40* (2006.01)

(52) U.S. Cl. .................. 257/700; 257/760; 257/E23.02
(58) Field of Classification Search ................ 257/700, 257/760, E23.02
See application file for complete search history.

(56) References Cited

U.S. PATENT DOCUMENTS 6,656,828 B1 * 12/2003 Maitani et al. ............. 438/613
6,998,325 B2 *  2/2006 Yunogami et al. .......... 438/409

* cited by examiner

*Primary Examiner*—William M. Brewster
(74) *Attorney, Agent, or Firm*—Yingsheng Tung; Wade James Brady, III; Frederick J. Telecky, Jr.

(57) ABSTRACT

The present invention provides a metallization scheme, a method for manufacturing the metallization scheme, and an integrated circuit including the metallization scheme. In one aspect, the metallization scheme (300) includes a protective layer (320) located over a substrate (310), and a conductive layer (330) located over the protective layer (320). The metallization scheme (300) further includes a stress-reducing low-modulus material (340) located between the protective layer (320) and the conductive layer (330).

9 Claims, 3 Drawing Sheets

METALLIZATION SCHEME INCLUDING A LOW MODULUS STRUCTURE

TECHNICAL FIELD OF THE INVENTION

The present invention is directed, in general, to metallization schemes, and more specifically to novel metallization schemes to mitigate the effects of stress, a method of manufacture therefore, and an integrated circuit including the same.

BACKGROUND OF THE INVENTION

An integrated circuit comprises electrical components such as transistors formed on a substrate, the electrical components connected by conductive paths called interconnects. The integrated circuit is typically covered with a protective overcoat layer to protect the circuit from moisture and mechanical damage. In certain applications, such as for high current, MOSFETs, a thick conductive layer may be used to form a low-resistance path over the protective overcoat through which to conduct high current that cannot be accommodated at lower interconnect levels.

When certain materials are used for the top conductor, for example copper, the top conductor may have significant residual stress at room temperature due to the nature of processing of the layer. Certain metallic thin films typically have a high tensile stress at room temperature because they have been annealed at a higher temperature, at which the zero thermal stress point is set. When the wafer cools, the stress in the top conductor becomes tensile due to the metal's greater coefficient of thermal expansion than the substrate, which is typically silicon. When significant areas of uninterrupted top conductor material remain after patterning the level, the accumulated stress of these areas can induce significant deformation of the wafer, causing it to curve in such a way that subsequent processing tools may not be able to properly handle the wafer. Moreover, the presence of the stress makes the wafer more prone to breakage in later steps, especially when the wafer is thinned prior to sawing for packaging. These problems have the effect of causing wafer loss and increased cycle time, which are economically undesirable in an industry for which the profit margin on commodity products is typically small.

Turning to FIG. 1, illustrated is a top view of a semiconductor device 100 that might experience the tensile stress issues previously discussed. The semiconductor device 100 of FIG. 1 includes bond pads 110 and low-resistance interconnects 120. FIG. 1 illustrates the extent of coverage by the top metallization, e.g., the combination of bond pads 110 and low-resistance interconnects 120. As illustrated, this is a significant fraction of the total area of the product. While FIG. 1 illustrates a device with about 60% coverage, future devices are anticipated to utilize 80% or more coverage by the top metallization. Bond pads 110 typically have an edge length of about 60-90 µm, while the low-resistance interconnects 120 may span almost the entire length of a device die, which may be hundreds to thousands of microns.

While any tensile layer will exert a force on the substrate upon which it is fabricated, the amount of transmitted force increases both with greater degree of coverage and with longer uninterrupted expanses of the layer. Thus, for example, the bond pads 110 will transmit less force to the substrate than will the larger low-resistance interconnects 120.

Turning now to FIGS. 2A, illustrated is a top view of a wafer 200 experiencing bowing as a result of the aforementioned tensile stress. The wafer 200 illustrated in FIG. 2A contains a plurality of semiconductor devices 100, such as those illustrated in FIG. 1. As further shown, the wafer 200 is experiencing stress vectors 210, which may represent the net force transmitted to the wafer by the combined effect of the top metallization of the individual die, for example including the bond pads 110 and the low-resistance interconnects 120.

Turning now to FIG. 2B, illustrated is a side view of the wafer 200 illustrated in FIG. 2A. FIG. 2B further illustrates the curvature induced on wafer 200 by stress vectors 210. The curvature illustrated can result in a vertical displacement of the edge of the wafer 200, relative to the center, of 300 µm for a full thickness 200 mm wafer. This displacement is sufficient to cause unreliable wafer handling in some fabrication tools. After the wafer 200 is thinned prior to separating the semiconductor devices 100, edge displacement typically increases, and can exceed 3-5 mm. This obviously increases the severity of manufacturing issues and may threaten the structural integrity of the wafer 200.

Certain stress reduction methods to reduce the effects of the tensile stress are well known. One such method involves removing portions of the low-resistance interconnects 120 to reduce the extent of uninterrupted metal. While such a method will reduce the stress and the resulting wafer bow, the method is undesirable in high-current applications because it reduces the conductive cross-section of the interconnect, increasing resistance and power dissipation.

Consequently, what is needed in the art is a new method for manufacturing metallization schemes that does not experience the aforementioned drawbacks of the prior art.

SUMMARY OF THE INVENTION

To address the above-described deficiencies of the prior art, the present invention provides a metallization scheme, a method for manufacturing the metallization scheme, and an integrated circuit including the metallization scheme. In one aspect, the metallization scheme includes a protective layer located over a substrate, and a conductive layer located over the protective layer. The metallization scheme further includes a stress-reducing low-modulus material located between the protective layer and the conductive layer.

In another aspect, the present invention provides a method for manufacturing a metallization scheme. The method includes providing a protective layer over a substrate, creating a conductive layer over the protective layer, and forming a stress-reducing low-modulus material between the protective layer and the conductive layer.

In yet another aspect, the present invention provides an integrated circuit. The integrated circuit includes transistors located over a substrate, dielectric layers located over the transistors, and interconnects located within the dielectric layers for contacting the transistors. A protective layer is located over the interconnects, and a conductive layer is located over the protective layer. A stress reducing low-modulus material is located between the protective layer and the conductive layer.

The foregoing has outlined preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention.

BRIEF DESCRIPTION OF THE DRAWINGS

The invention is best understood from the following detailed description when read with the accompanying Figures. It is emphasized that in accordance with the standard practice in the semiconductor industry, various features are not drawn to scale. In fact, the dimensions of the various features may be arbitrarily increased or reduced for clarity of discussion. Reference is now made to the following descriptions taken in conjunction with the accompanying drawings, in which.

Prior Art

Prior Art

DETAILED DESCRIPTION

Figure 1:
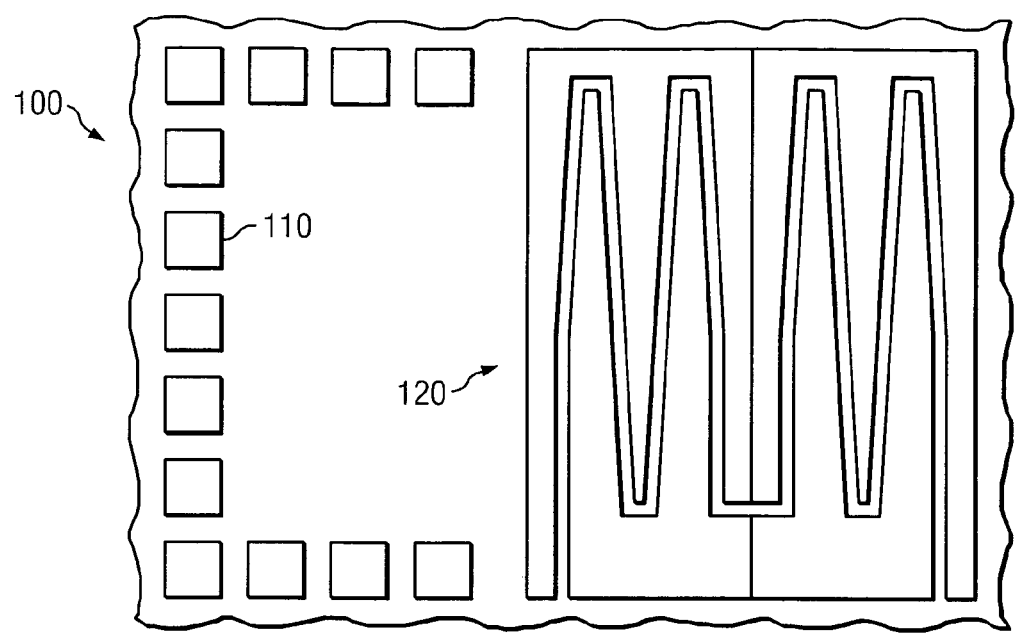
FIG. 1 illustrates an exemplary semiconductor device utilizing large areas of uninterrupted top metal.
Figure 2A:
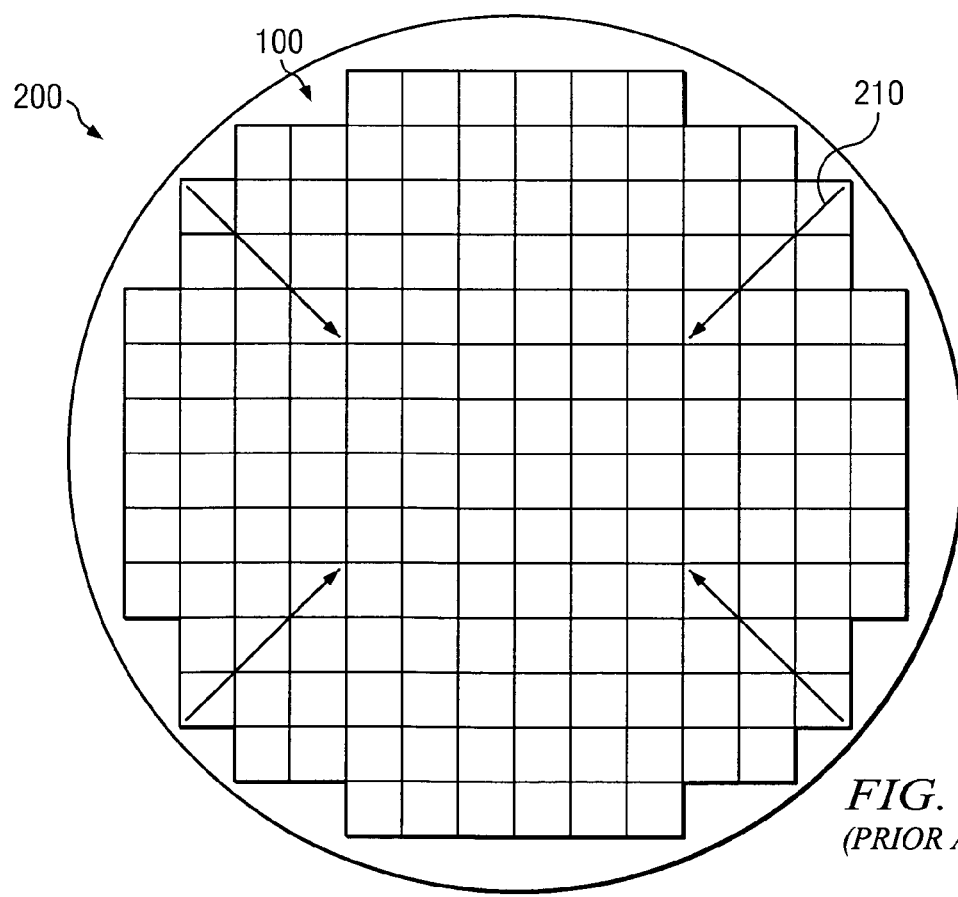
FIGS. 2A and 2B illustrate a top view and side view, respectively, of a semiconductor wafer experiencing wafer bow.
Figure 2B:
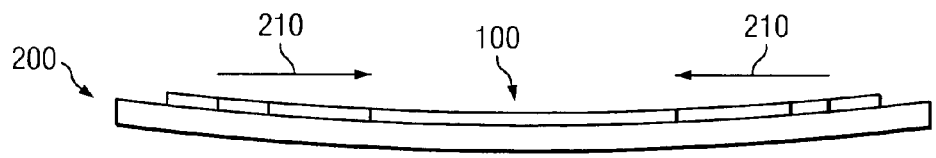
Figure 3:
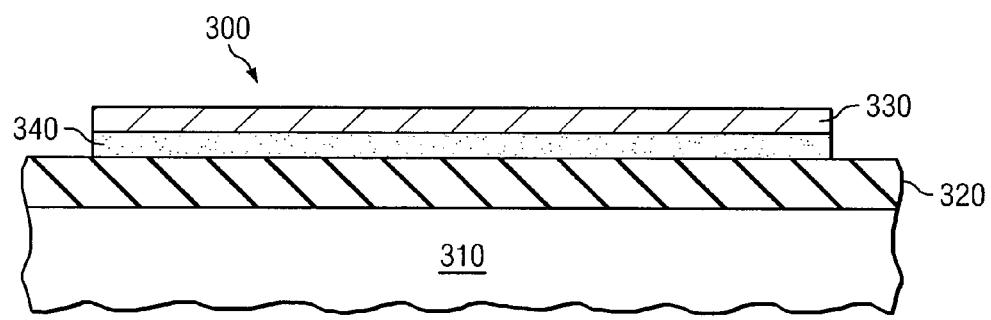
FIG. 3 illustrates an exemplary embodiment of the invention, in which a substantially continuous layer of stress mitigating material underlies the conductive layer.

Turning initially to FIG. 3, illustrated is a cross-sectional view of a metallization scheme 300 manufactured in accordance with the principles of the present invention. The metallization scheme of FIG. 3, initially includes a substrate 310. While the substrate 310 may comprise a plurality of different materials, layers or features, one embodiment of the invention has the substrate 310 comprising a plurality of electrically operable components or conductive interconnections. However, as previously mentioned, the substrate 310 may comprise other materials, layers or features without departing from the scope of the present invention.

Advantageously located over the substrate 310 in the embodiment of FIG. 3 is protective layer 320. The protective layer 320, in the embodiment of FIG. 3, happens to be a protective overcoat (PO) positioned on a top surface of the substrate 310. In one exemplary embodiment, the protective layer 320 comprises a material sufficient to provide the requisite mechanical and environmental protection required for the components thereunder. In the advantageous embodiment of FIG. 3, without limitation, the protective layer 320 comprises one or more materials selected from the group consisting of silicon dioxide, silicon nitride, silicon oxynitride or another similar material. The protective layer 320 may obviously comprise a number of different thicknesses while remaining within the purview of the invention, however, one ideal embodiment has the protective layer 320 thickness ranging from about 0.5 μm to about 2.0 μm. The present invention should, nonetheless, not be limited to such thicknesses.

Positioned over the protective layer 320 is a conductive layer 330. The conductive layer 330 may comprise a plurality of different materials, layers, thicknesses, etc. while remaining within the scope of the present invention. In one advantageous embodiment the conductive layer 330 may comprise a low-resistance interconnect. The conductive layer 330 may further comprise a primary conductor in addition to one or more secondary layers. Moreover, the primary conductor may be copper. The secondary layers, among other possible uses, should contain the requisite properties to interface the primary conductor to overlying and underlying materials. As one might expect, the conductive layer 330 may be manufactured using conventional processes.

The conductive layer 330 may exhibit tensile stress at room temperature. Such stress may be caused by, among others, two known effects. First, intrinsic defects in the material related to the technique used to form the conductive layer 330 may result in intrinsic stress. Second, thermal processes used after formation of the conductive layer 330 may set the zero-stress temperature at a temperature higher than room temperature. In the latter case, the tensile stress of the conductive layer increases as the temperature is lowered below the zero-stress temperature, due to the conductive layer's greater coefficient of thermal expansion than the substrate, which is typically silicon. These effects solely or in combination contribute substantially to the total tensile stress of the conductive layer 330. Moreover, the force exerted on the substrate will typically increase with increasing thickness of the conductive layer 330. When the force exerted by the tensile stress exceeds a value related to the stiffness of the substrate 310, then the aforementioned manufacturing issues may result.

Uniquely located between the protective layer 320 and the conductive layer 330 is a stress-reducing low-modulus material 340. The stress-reducing low-modulus material 340, advantageous to the present invention, provides an interface between the conductive layer 330 and the protective layer 320, and thus the substrate 310. The stress-reducing low-modulus material 340, in an advantageous embodiment, is uniquely able to deform in response to a shear stress caused by a tensile stress that may be present in the conductive layer 330. Accordingly, the stress-reducing low-modulus material 340 allows movement of the substrate 310 relative to the conductive layer 330, and thus results in reduced bow of substrate 310.

The stress-reducing low-modulus material 340 may comprise a number of different materials. However, in an exemplary embodiment it should be formed from a material that has a lower modulus than that of the substrate 310, and is compatible with subsequent processing and assembly operations. For example, one particular embodiment exists wherein the substrate 310 comprises silicon. As those skilled in the art appreciate, the measured modulus of silicon will vary depending on the measurement technique. Depending on the technique used, silicon typically has accepted elastic modulus values ranging from about 130 GPa to about 200 GPa. Accordingly, in staying within the preferred bounds of the present invention, the elastic modulus of the stress-reducing low-modulus material 340 should be less than that of silicon measured by the same technique. It goes without saying that the substrate 310 may comprise other materials, and thus the upper bound of the elastic modulus for the stress-reducing low-modulus material 340 could then be different.

In an exemplary embodiment, the low-modulus material is an organic material, and may be deposited by a conventional technique such as, for example, spin-coating or screen printing. For example polybenzoxazole (PBO) produced by Dow Chemical Company, among others, has a modulus of about 17 GPa, and is manufactured in a form compatible with semiconductor processing technology. Other materials that may be employed include benzocyclobutene (BCB), polyimides, silicone-modified polyimides, flexible epoxy, and silicon-modified flexible epoxy. Equally important may be the thickness of the stress-reducing low-modulus material 340. Accordingly, in one advantageous embodiment, the thickness of the stress-reducing low-modulus material 340 ranges from about 0.5 μm to about 2.0 μm.

In the embodiment shown and discussed with respect to FIG. 3, the stress-reducing low-modulus material 340 is formed as a substantially continuous layer between the protective layer 320, and thus the substrate 310, and the conductive layer 330. This continuous nature may allow the stress-reducing low-modulus material 340 to provide a continuous distribution of the tensile stress created by the conductive layer 330 across the stress-reducing low-modulus material 340. Advantages may be realized from this distribution.

Figure 4:
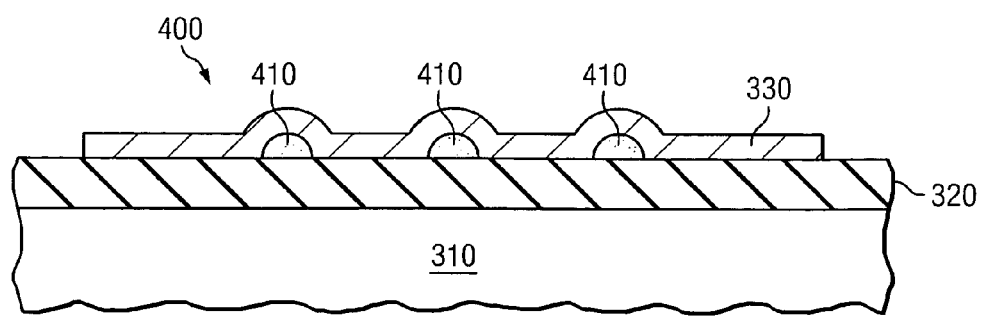
FIG. 4 illustrates an exemplary embodiment of the invention, in which a patterned layer of low-modulus material is used to relieve stress in the conductive layer.

Turning now briefly to FIG. 4, illustrated is a cross-sectional view of an alternative embodiment of a metallization scheme 400 manufactured in accordance with the principles of the present invention. The metallization scheme 400 is substantially similar to the metallization scheme 300 illustrated in FIG. 3, with the exception that the stress-reducing low-modulus material 410 of FIG. 4 does not form a continuous layer as did the stress-reducing low-modulus material 340 of FIG. 3. In the embodiment of FIG. 4, the stress-reducing low-modulus material 410 is patterned to produce stress-reducing features located between the protective layer 320 and the conductive layer 330.

In accordance with the principles of the present invention, the stress-reducing low-modulus material 410 may be a line pattern. However, the invention is not limited to such a configuration. In general, the geometry of stress-reducing low-modulus material 410 will be determined by analysis of the stress of the conductive layer 330. Such analysis may be empirical, based on experience and insight of the designer, and may be numerical, such as by finite element modeling. Any such technique, and the resulting geometries, is within the scope of the invention. The geometry of the low-modulus features resulting from the analysis may include straight lines, curved lines, and other regular or arbitrary shapes, including substantially circular symmetric geometries, such as unfilled circles and filled circles (dots), as appropriate. Moreover, low-modulus features with different geometries may be combined in a single design.

In another embodiment, a sacrificial material may be formed or patterned on the protective layer 320, and the conductive layer 330 formed thereover. Subsequently, the sacrificial layer may be removed by thermal or chemical processing to leave a void, or "air gap," under the conductive layer 330. In this embodiment, the void, or air gap, would constitute the stress-reducing low-modulus material 410. The lack of support under the conductive layer 330 in this embodiment might impose an additional design constraint on the size and shape of the void to ensure that the unsupported portions of the conductive layer 330 are compatible with subsequent processing.

Figure 5:
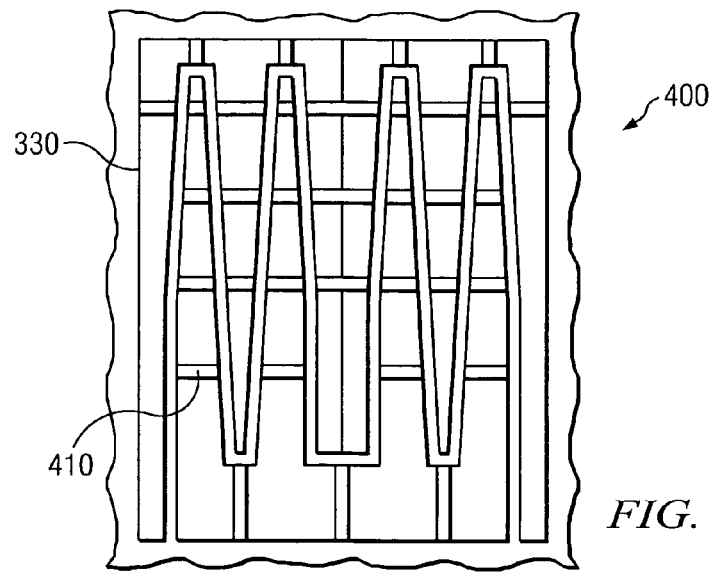
FIG. 5 illustrates a top view of the exemplary device of FIG. 4 fabricated according to the principles of the claimed invention.

Turning now briefly to FIG. 5, illustrated is a plan view of the metallization scheme 400 illustrated in FIG. 4. As illustrated in FIG. 5, the stress-reducing low-modulus material 410 has been deposited or patterned by suitable means to produce a line pattern. In an exemplary embodiment, the lines in this pattern are generally positioned such that a long axis of each line is perpendicular to the local stress resulting from long expanses of uninterrupted portions of the conductive layer 330. While this embodiment shows the lines configured such that their long axes are generally aligned with an X-Y coordinate system, the invention may be practiced producing features with arbitrary geometry, arranged in any suitable manner as dictated by the aforementioned analysis.

The use of the metallization scheme of the present invention provides a number of advantages over the prior art. For example, advantageous to the present invention, the use of the low-modulus material to reduce deformation of the substrate provides a degree of freedom that was not previously available to the designer to compensate for the stress resulting from a thick low-resistance layer. Using the metallization scheme of the present invention, the designer may be able to reduce the effect of using a thick low-resistance layer without the need to remove portions of the low-resistance layer that might interrupt the path of current flow through the low-resistance layer.

Figure 6:
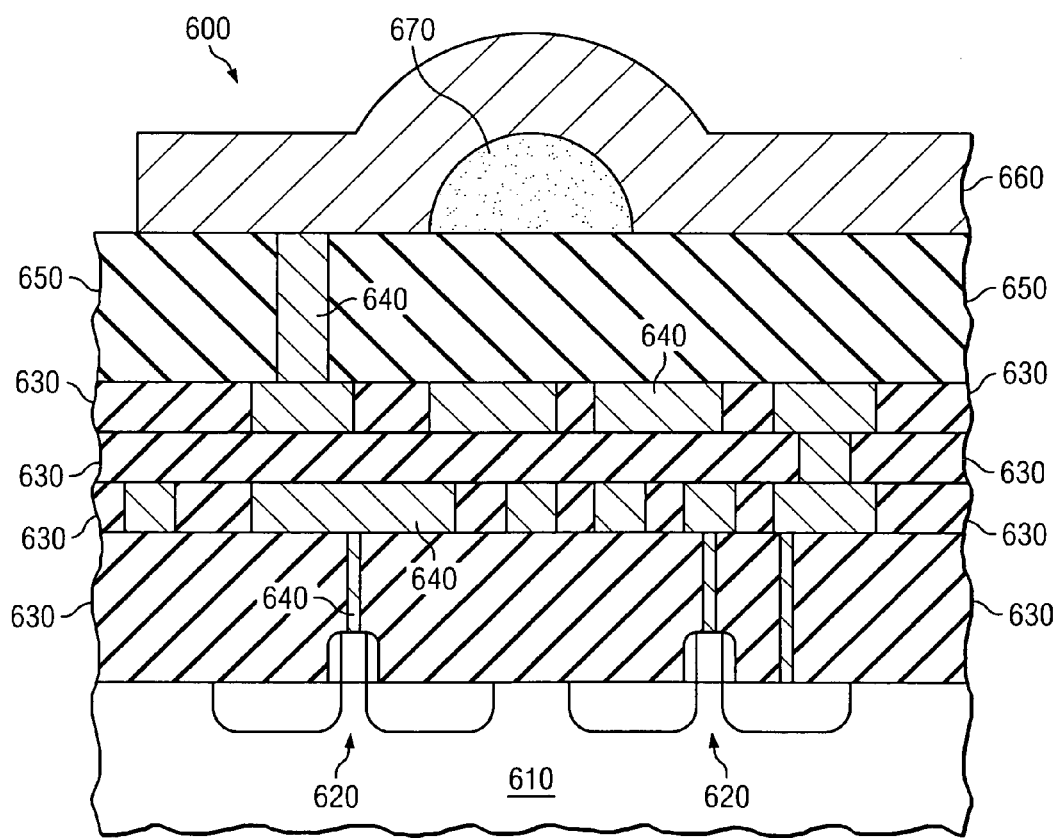
FIG. 6 illustrates a sectional view of an integrated circuit (IC) incorporating semiconductor components, interconnected with contacts, vias, and metal traces.

Referring now to FIG. 6, illustrated is an exemplary cross-sectional view of an integrated circuit (IC) 600 incorporating a metallization scheme constructed according to the principles of the present invention. The IC 600 may include MOS, BiCMOS or bipolar components, and may further include passive components, such as capacitors, inductors or resistors. It may also include optical components or optoelectronic components. Those skilled in the art are familiar with these various types of components and their manufacture. In the particular embodiment illustrated in FIG. 6, the IC 600 includes a substrate 610, over which are formed transistor components 620, having dielectric layers 630 located thereover. Additionally, interconnect structures 640 are located within the dielectric layers 630 to interconnect various components, thus forming the operational integrated circuit 600. A protective layer 650 is located over the substrate 610, and a conductive layer 660 is located thereover. A stress-reducing low-modulus material 670 is located between the protective layer 650 and the conductive layer 660. The interconnect architecture of the IC 600 is exemplary of one that may be fabricated according to the principles of the invention. It will be apparent to one skilled in the art that several variations of the exemplary interconnect architecture may be fabricated according to the principles of the invention with similarly advantageous results.

Although the present invention has been described in detail, those skilled in the art should understand that they could make various changes, substitutions and alterations herein without departing from the spirit and scope of the invention in its broadest form.

What is claimed is:

1. A semiconductor device, comprising:
    a substrate having a first modulus of elasticity;
    transistor components at the surface of the substrate;
    dielectric layers over the transistor components;
    interconnect structures imbedded in the dielectric layers connecting the transistor components;
    a protective layer over the dielectric layers and the interconnect structures, having a top surface;
    a patterned low-modulus structure of material having a second modulus of elasticity lower than the first modulus of elasticity contacting the top surface of the protective layer; and
    a conductive layer having a long expansive of uninterrupted portion positioned perpendicular to and contacting the patterned structure of low-modulus material and contacting the top surface of the protective layer and contacting the interconnect structure.

2. The device of claim 1, wherein the conductive layer comprises copper.

3. The device of claim 1, wherein the transistor components form a part of an integrated circuit, and the conductive layer covers over 60% of the integrated circuit.

4. The device of claim 3, wherein the conductive layer covers over 80% of the integrated circuit.

5. The device of claim 1, wherein the conductive layer forms a interdigitating pattern.

6. The device of claim 5, wherein the low-modulus material forms a linear pattern.

7. The device of claim 6, wherein the lines of the low-modulus material run substantially perpendicular to the digits of the conductive layer.

8. The device of claim 1, wherein the low-modulus material comprises a material selected from the group consisting of polybenzoxazole, benzocyclobutene, polyimides, silicone-modified polyimides, flexible epoxy, and silicon-modified flexible epoxy.

9. The device of claim 1, wherein the low-modulus material comprises air.

* * * * *